United States Patent [19]

Umimoto et al.

[11] Patent Number: 5,584,964
[45] Date of Patent: Dec. 17, 1996

[54] METHOD OF PRODUCING SEMICONDUCTOR DEVICE WITH VISCOUS FLOW OF SILICON OXIDE

[75] Inventors: Hiroyuki Umimoto, Moriguchi; Shin Hashimoto; Shinji Odanaka, both of Hirakata, all of Japan

[73] Assignee: Matsushita Electric Industrial Co., Ltd., Osaka, Japan

[21] Appl. No.: 453,806

[22] Filed: May 30, 1995

Related U.S. Application Data

[62] Division of Ser. No. 34,763, Mar. 19, 1993, Pat. No. 5,455,205.

[30] Foreign Application Priority Data

Mar. 25, 1992 [JP] Japan ..................... 4-066772

[51] Int. Cl.⁶ ............................. H01L 21/3105
[52] U.S. Cl. .................. 156/657.1; 437/228; 437/240; 437/248
[58] Field of Search .................. 437/228, 231, 437/238, 235, 240, 248; 156/657.1

[56] References Cited

U.S. PATENT DOCUMENTS

| | | | |
|---|---|---|---|
| 5,069,747 | 12/1991 | Cathey et al. | 156/643 |
| 5,112,776 | 5/1992 | Marks et al. | 437/228 |
| 5,244,841 | 9/1993 | Marks et al. | 437/228 |
| 5,250,468 | 10/1993 | Matsuura et al. | 437/240 |
| 5,336,640 | 8/1994 | Sato | 437/240 |

FOREIGN PATENT DOCUMENTS

| | | |
|---|---|---|
| 61-55258 | 11/1986 | Japan . |
| 226064 | 1/1990 | Japan . |

Primary Examiner—R. Bruce Breneman
Assistant Examiner—Anita Alanko
Attorney, Agent, or Firm—Watson Cole Stevens Davis, P.L.L.C.

[57] ABSTRACT

There is disclosed a method of producing a semiconductor memory device. An interlayer insulation film is formed on a semiconductor substrate including a switching transistor. Then, a memory node pattern reaching an active region of the switching transistor is formed. A cell plate electrode pattern is formed through an insulation film formed on the memory node in such a manner that a value obtained by subtracting a thickness of a polycrystalline silicon film for a cell plate electrode from an overlapping dimension of a memory node pattern and the cell plate electrode pattern is not less than two times larger and not more than ten times larger than a thickness of deposition of a BPSG film. Then, the BPSG film is deposited on an entire surface, and then is caused to viscously flow by a heat treatment. Then, an aluminum wiring is formed on the BPSG film. With this construction, a step of the aluminum wiring in a boundary region between a memory cell array portion and a peripheral circuit portion, or in a word line-backing contact forming region, is decreased, thereby preventing the lowering of the yield of the aluminum wiring which is caused by the cutting of the aluminum wiring and the remaining of a residue of etching for a contact-forming electrode (for example, tungsten).

11 Claims, 13 Drawing Sheets

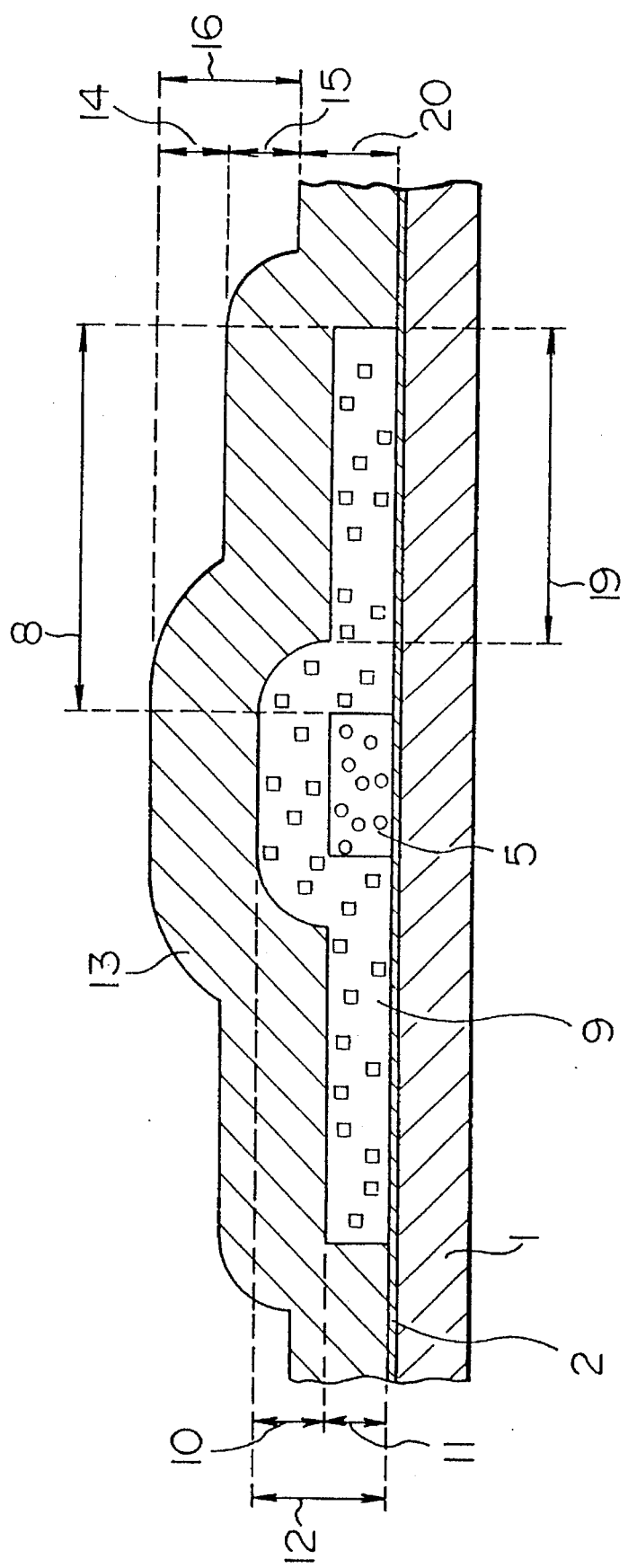

FIG. 7A
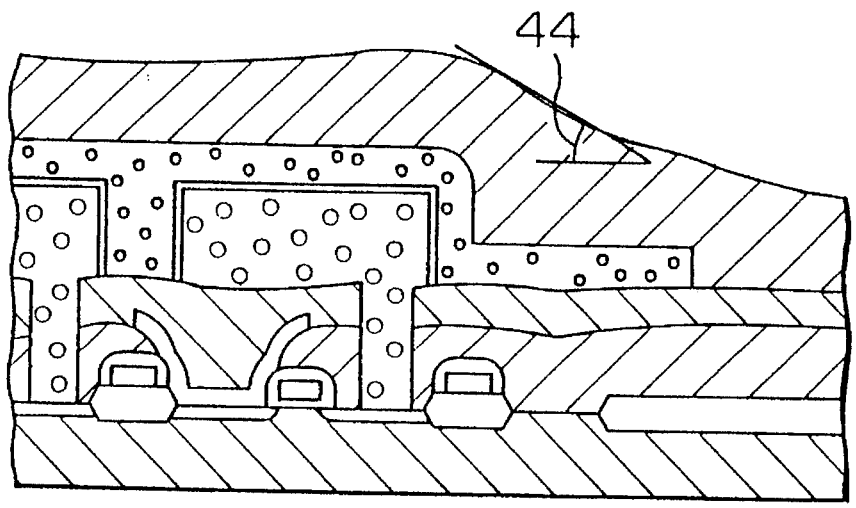
FIG. 7B
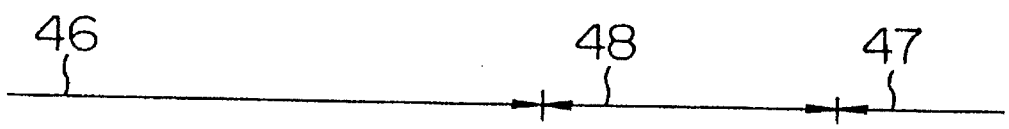
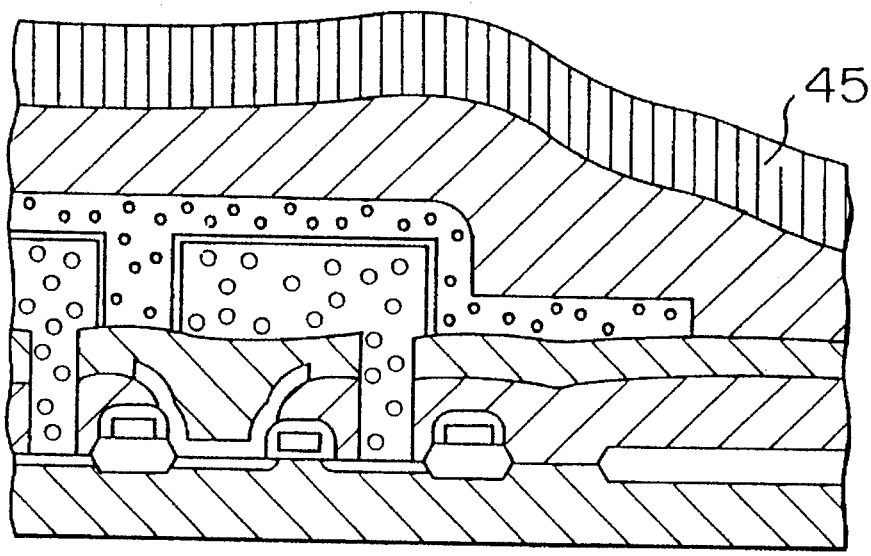

5,584,964

METHOD OF PRODUCING SEMICONDUCTOR DEVICE WITH VISCOUS FLOW OF SILICON OXIDE

This is a division of application Ser. No. 08/034,763, filed Mar. 19, 1993, now U.S. Pat. No. 5,455,205.

BACKGROUND OF THE INVENTION

This invention relates generally to a method of producing a semiconductor device, and more particularly to a flattening technique used in a method of producing a semiconductor memory device and a dynamic random access memory (DRAM).

In recent years, there has been an increasing in the degree of a memory node in a stack-type RAM with its finer and more highly-integrated design in order to fix a charge storage capacity.

One example of conventional methods of producing such a semiconductor device (particularly a semiconductor memory device) will now be described with reference to the drawings.

FIGS. 11A to 11D, 12A to 12C and 13a to 13b show a technique of forming a conventional semiconductor memory device.

As shown in FIG. 11A, word lines 24 are first formed. Then, as shown in FIG. 11B, after a silicon oxide film 25 is deposited, bit lines 26 are formed, and a silicon oxide film 27 is further formed. Then, as shown in FIG. 11C, a contact window 28 is formed by an anisotropic etching in such a manner that it reaches an n+active region of a switching transistor formed on a p-type silicon substrate 23. Then, a first polycrystalline silicon 29 containing impurities is deposited, and then a first resist pattern 30 is formed on this silicon 29. Then, as shown in FIG. 11D, using the first resist pattern 30 as a mask, the first polycrystalline silicon 29 containing the impurities is subjected by RIE to an anisotropic etching to form a memory node pattern 31. Then, as shown in FIG. 12A, a dielectric film 32, composed of a silicon oxide film and a silicon nitride film, is formed on the surface of the memory node pattern 31, and a second polycrystalline silicon 33 containing impurities is deposited through this dielectric film 32, and a second resist pattern 34 is formed on this second polycrystalline silicon 33. Then, as shown in FIG. 12B, suing this second resist pattern 34 as a mask, the second polycrystalline silicon film 33 containing the impurities is etched to form a cell plate electrode pattern 36. Then, as shown in FIG. 12C, a BPSG film 40 is deposited on the entire surface of the cell plate electrode pattern 36. Then, as shown in FIG. 13A, the BPSG film 40 is caused to viscously flow by a heat treatment. Finally, as shown in FIG. 13B, an aluminum wiring 45 is formed on the BPSG film 40.

Features of the above-mentioned method of producing a semiconductor memory device will now be described.

First, in the stack-type DRAM, in order to form a charge storage portion, the cell plate electrode pattern is designed with an overlapping dimension 35 in view of mask misalignment from the memory node pattern (see, for example, Japanese Patent Publication No. 61-55258). Generally, with respect to this overlapping dimension, the mask misalignment dimension is about 0.15 μm when an optical reduction exposure device is used, and a step on the substrate for the BPSG film in a boundary region between a memory cell array portion and a peripheral circuit portion, or in a word line-backing contact forming region, is produced mainly by the memory node and the cell plate electrode. If the height of the memory node is small, the inclination angle (flow angle 44) of the surface of the BPSG film is made small by a viscous flow of the BPSG film, and the step is made sufficiently gentle not to lower the wiring yield.

However, in the above construction, with a more highly-integrated design of the semiconductor memory device, in order to prevent a short channel effect of the switching transistor, the heat treatment for causing the viscous flow of the BPSG film must be carried out at low temperatures in a short time, so that the smoothing of the step becomes difficult. Further, with the highly-integrated design, in order to fix the charge storage capacity, the polycrystalline silicon film for the memory node must be increased in thickness, and the step in the boundary region between the memory cell array portion and the peripheral circuit portion, as well as the step in the memory cell word line-backing contact forming region, becomes excessive, and the viscous flow of the BPSG film under the conventional conditions can not make the step sufficiently smooth and gentle. As a result, the aluminum wiring is cut in the boundary region, and an etching residue for the embedded electrode (made, for example, of tungsten) for forming the word line-backing contact remains, and this has resulted in a problem that the yield of the aluminum wiring is adversely affected.

Methods which are thought to enhance the smoothing of the step by the viscous flow of the BPSG film are (1) to reduce the step on the substrate for the BPSG film, (2) to increase the thickness of the BPSG film, (3) to increase the concentration of impurities in the BPSG film, and (4) to carry out the heat treatment of the BPSG film at high temperatures for a long time.

In one conventional technique which uses the method (1) of reducing such a stop in the boundary region between the memory cell array portion and the peripheral circuit portion, only the memory cell forming region is selectively oxidized before the memory cell portion is formed, and then the oxide film is removed to beforehand make the memory cell forming region lower than the peripheral circuit forming region (For example, K. Sagara et al., 1992 Symposium on VLSI Technology, Digest of Technical Papers, pp. 10–11).

If the thickness of the BPSG film is increased using the method (2), it becomes difficult to form the embedded electrode when forming the contact by etching the BPSG film. When the impurity concentration is made excessive using the method (3), deposits develop on the surface of the BPSG film. When the heat treatment is carried out at high temperatures for a long time, using the method (4), the depth of the diffusion layer of the switching transistor increases to cause a short channel effect. Therefore, any of the above methods is not desirable.

SUMMARY OF THE INVENTION

With the above problems in view, it is an object of this invention to provide a method of producing a semiconductor memory device which prevents cutting of a wiring (for example, an aluminum wiring), and prevents remaining of an etching residue of an embedded electrode for forming a word line-backing contact, thereby enhancing the wiring yield.

According to a first aspect of the present invention, there is provided a method of producing a semiconductor device comprising the steps of:

depositing a second thin film on a semiconductor substrate or a first thin film;

forming a pattern on the second thin film by a first photoresist, and etching the second thin film, using the first photoresist as a mask, to form a pattern;

depositing a third thin film on an entire surface including the second thin film;

etching the third thin film, using a second photoresist on the third thin film as a mask, to form a pattern covering the second thin film;

depositing a silicon oxide film on the third thin film, the silicon oxide film containing impurities; and causing the silicon oxide film to viscously flow by a heat treatment;

wherein two steps resulting respectively from the pattern of the second thin film and the pattern of the third thin film are formed on the surface of an end portion of the third thin film pattern.

The first, second and third thin films are smaller in viscous flow than the silicon oxide film containing the impurities. The silicon oxide film containing the impurities can be a BPSG film.

According to a second aspect of the present invention, there is provided a method of producing a semiconductor device comprising the steps of:

depositing a second thin film on a semiconductor substrate or a first thin film;

forming a pattern on the second thin film by a first photoresist, and etching the second thin film, using the first photoresist as a mask, to form a pattern;

depositing a third thin film on an entire surface including the second thin film;

etching the third thin film, using a second photoresist on the third thin film as a mask, to form a pattern covering the second thin film;

depositing a silicon oxide film on the third thin film, the silicon oxide film containing impurities; and causing the silicon oxide film to viscously flow by a heat treatment;

wherein a value obtained by subtracting the thickness of the third thin film from an overlapping dimension of the second thin film pattern and the third thin film pattern is not less than two times larger and not more than ten times larger than the thickness of deposition of the silicon oxide film.

The first, second and third thin films are smaller in viscous flow than the silicon oxide film containing the impurities. The silicon oxide film containing the impurities can be a BPSG film.

According to a third aspect of the present invention, there is provided a method of producing a semiconductor device comprising the steps of:

forming an interlayer insulation film on a semiconductor substrate including a semiconductor element, and forming a contact window reaching an active region of the semiconductor element;

depositing first polycrystalline silicon containing impurities in such a manner that the first polycrystalline silicon reaches the active region;

etching the first polycrystalline silicon to form a memory node pattern;

forming an insulation film on a surface of the memory node;

depositing second polycrystalline silicon through the insulation film;

depositing a silicon oxide film containing impurities;

causing the silicon oxide film to viscously flow by a heat treatment; and forming an aluminum wiring on the silicon oxide film;

wherein two steps resulting respectively from the pattern of the first polycrystalline silicon and the pattern of the second polycrystalline silicon are formed on the surface of the second polycrystalline silicon pattern.

The silicon oxide film containing the impurities can be a BPSG film.

According to a fourth aspect of the present invention, there is provided a method of producing a semiconductor device comprising the steps of:

forming an interlayer insulation film on a semiconductor substrate including a semiconductor element, and forming a contact window reaching an active region of the semiconductor element;

depositing first polycrystalline silicon containing impurities in such a manner that the first polycrystalline silicon reaches the active region;

etching the first polycrystalline silicon to form a memory node pattern;

forming an insulation film on a surface of the memory node;

depositing second polycrystalline silicon through the insulation film;

depositing a silicon oxide film containing impurities;

causing the silicon oxide film to viscously flow by a heat treatment; and forming an aluminum wiring on the silicon oxide film;

wherein a value obtained by subtracting the thickness of the second polycrystalline silicon film from an overlapping dimension of the memory node pattern and a cell plate electrode pattern is not less than two times larger and not more than ten times larger than the thickness of deposition of the silicon oxide film.

The silicon oxide film containing the impurities can be a BPSG film.

According to a fifth aspect of the present invention, there is provided a method of producing a semiconductor device comprising the steps of:

forming an interlayer insulation film on a semiconductor substrate including a switching transistor, and forming a contact window reaching an active region of the switching transistor;

depositing first polycrystalline silicon containing impurities in such a manner that the first polycrystalline silicon reaches the active region;

etching the first polycrystalline silicon to form a memory node pattern;

forming an insulating film on a surface of the memory node;

depositing second polycrystalline silicon through the insulating film;

forming a cell plate electrode pattern in such a manner that an overlapping dimension of the memory node pattern and the cell plate electrode pattern is not less than two times larger and not more than four times larger than the first polycrystalline silicon film for the memory node;

depositing a silicon oxide film containing impurities;

causing the silicon oxide film to viscously flow by a heat treatment; and forming an aluminum wiring on the silicon oxide film.

The silicon oxide film containing the impurities can be a BPSG film.

In the present invention, with the above-mentioned construction, the extension portion of the upper thin film extending from the lower thin film, or the extension portion of the cell plate electrode pattern extending from the memory node pattern, is provided. By changing the extension amount (the overlapping dimension), the step beneath the BPSG film in a peripheral circuit portion, or the step (which results from the heights of the memory node and the cell plate electrode) beneath the BPSG film in a boundary region between a memory cell array portion and the peripheral circuit portion or in a word line-backing contact forming region can be divided into two steps (that is, into a stair-like configuration) formed by the two thin films, or can be divided into two steps (that is, into a stair-like configuration) resulting respectively from the degree of memory node and the degree of cell plate electrode height. At the same time, the step on the surface of the BPSG film deposited thereon can be divided into two steps to provide a stair-like configuration. Generally, when the height of the step is small, the smoothing of the step by a viscous flow of the BPSG film can be achieved more easily, and therefore when one step is divided into two steps, the smoothing can be made more easily. The drive force for causing the viscous flow of the BPSG film by a heat treatment is not gravitational, but the surface tension of the BPSG film (see, for example, R. A. Levy and K. Nassau, J. Electrochem. Soc., vol. 133, no. 7, pp. 1417–1424, 1986), and therefore the degree of viscous flow of the BPSG film depends greatly on the configuration of the surface of the BPSG film. When the distance between the two steps on the surface of the BPSG film is brought into an optimum value by changing the degree of extension of the upper thin film pattern or the cell plate electrode pattern, the drive force for the viscous flow of the BPSG film is further increased by the interaction of the viscous flow drive forces developing respectively at the two steps. As a result, the step is made smoother and reduced, and the cutting of a wire (for example, an aluminum wiring) and the remaining of a residue of etching for a contact-forming electrode are prevented, thereby enhancing the wiring yield.

BRIEF DESCRIPTION OF THE DRAWINGS

FIG. 3 is a partial, cross-sectional view showing a process for producing a semiconductor memory device according to a second embodiment of the invention;

FIGS. 7A and 7B are partial, cross-sectional views showing the process for producing a semiconductor memory device according to the third embodiment of the invention;

DESCRIPTION OF PREFERRED EMBODIMENTS

Methods of producing a semiconductor memory device according to the present invention will now be described with reference to the drawings.

EMBODIMENT 1

Figure 1A:
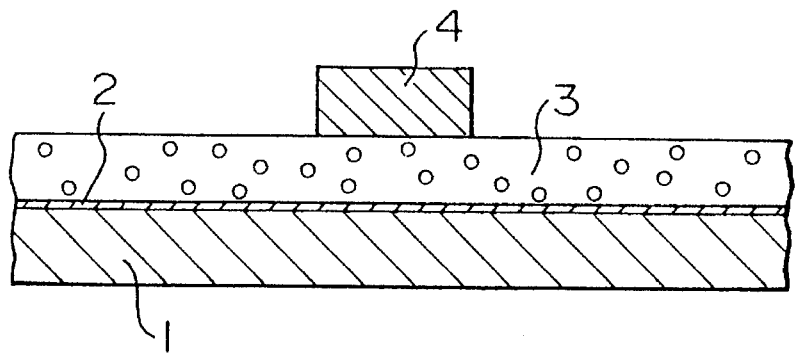
FIGS. 1A to 1D are partial, cross-sectional views showing a process for producing a semiconductor memory device according to a first embodiment of the invention.
Figure 1B:
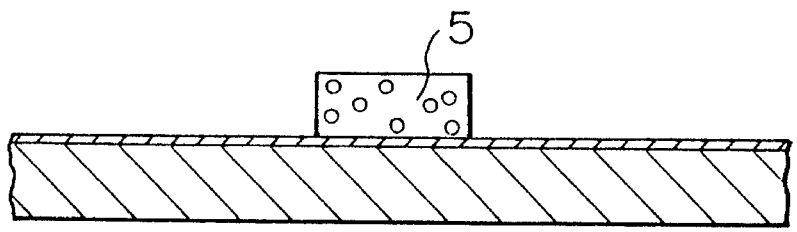
Figure 1C:
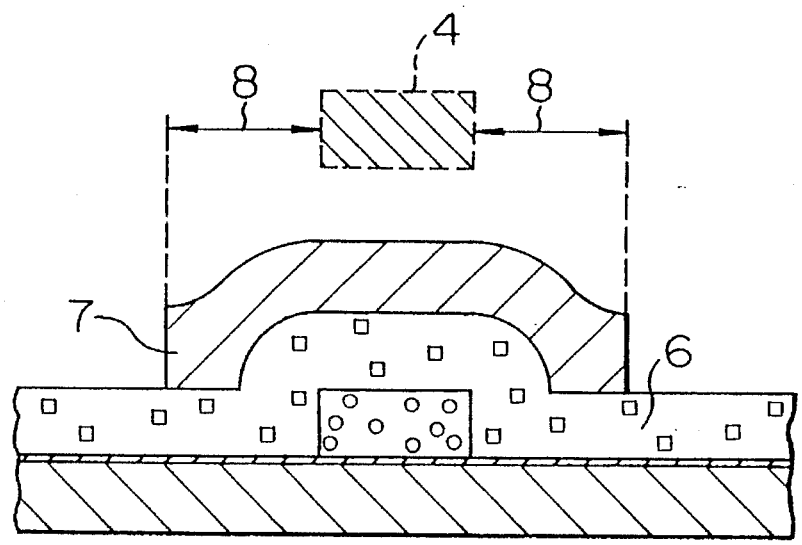
Figure 1D:
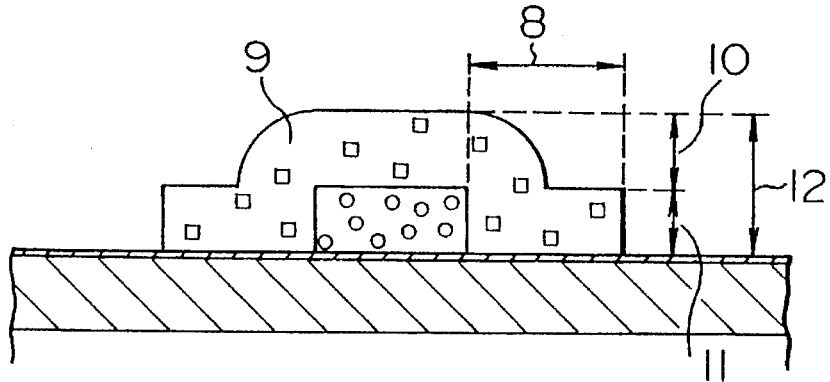
Figure 2A:
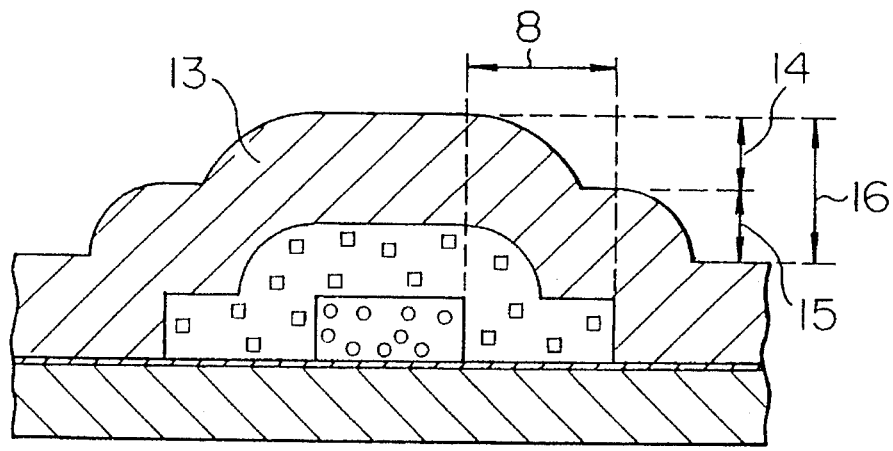
FIGS. 2A to 2C are partial, cross-sectional views showing the process for producing a semiconductor memory device according to the first embodiment of the invention.
Figure 2B:
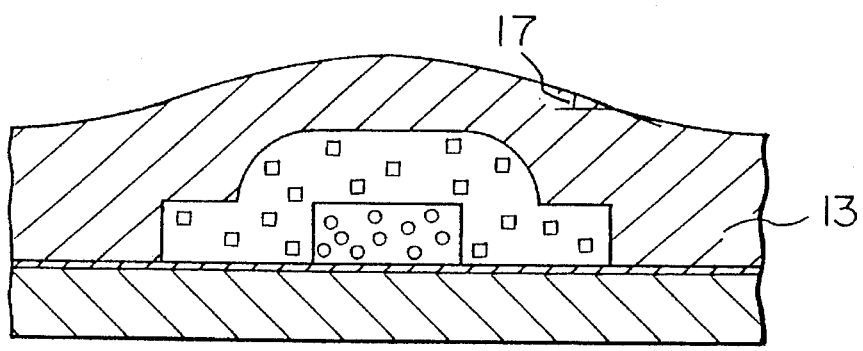
Figure 2C:
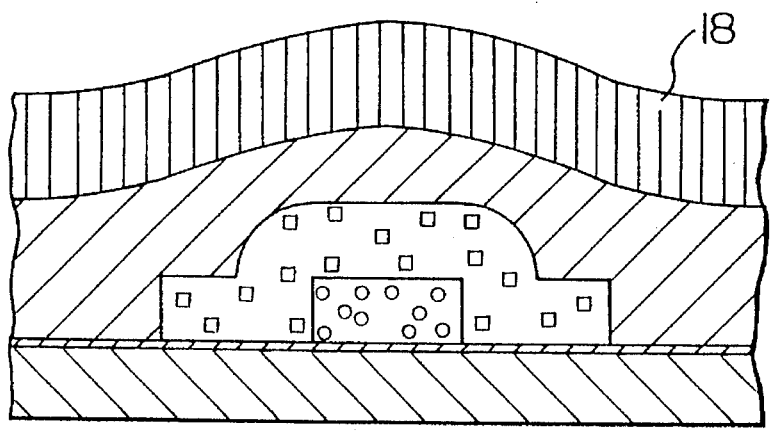

FIGS. 1 and 2 shown a method of producing a semiconductor memory device according to a first embodiment of the present invention. As shown in FIG. 1A, an oxide film (first thin film) 2 having a thickness of 16 nm is formed on a silicon substrate 1, and a polycrystalline silicon film (second thin film) 3 containing impurities and having a thickness of 250 nm is deposited on the oxide film 2, and then a first resist pattern 4 is formed on the polycrystalline silicon film 3. Then, as shown in FIG. 1B, using the first resist pattern 4 as a mask, the polycrystalline silicon film 3 containing the impurities is subjected by RIE to an anisotropic etching to form a polycrystalline silicon pattern 5. Then, as shown in FIG. 1C, an oxide film (third thin film, for example, of HTO or NSG) 6, containing no impurity and having a thickness of 250 nm, is deposited. Then, a second resist pattern 7 is formed in such a manner that an overlapping dimension 8 of the first resist pattern 4 and the second resist pattern 7 becomes 0.5 μm. Then, as shown in FIG. 1D, using the second resist pattern 7 as a mask, the oxide film 6 containing no impurity is subjected by RIE to an anisotropic etching to form an oxide film pattern 9 containing no impurity, the oxide film pattern 9 having two steps, that is, a first step a 10 resulting from the polycrystalline silicon pattern 5 containing the impurities and a second step a 11 resulting from the oxide film pattern 9 containing no impurity. At this time, the height 10 of the first step a is equal to the thickness of the polycrystalline silicon film 5 containing the impurities, and the height 11 of the second step a is equal to the thickness of the oxide film 6 containing no impurity, and the height of the total step a 12 is equal to the sum of the heights of the first and second steps a 10 and a 11. Then, a s shown in FIG. 2A, a BPSG film 13 having a thickness of 400 nm is deposited. Two steps, that is, a first step b 14 and a second step b 15, are formed on the surface of the BPSG film 13. At this time, the height 14 of the first step b is equal to the height 10 of the first step a, and the height 15 of the second step b is equal to the height 11 of the second step a, and the height of the total step b 16 is equal to the height 12 of the total step a. Then, as shown in FIG. 2B, a heat treatment is applied to cause a viscous flow of the BPSG film 13. At this time, in order to prevent cutting of a wiring 18 to be formed on the BPSG film 13, it is preferred that a flow angle 17 of the BPSG film should be not more than 30 degrees. Finally, as shown in FIG. 2C, the wiring 18 is formed on the BPSG film 13.

As described above, the overlapping dimension 8 is 0.5 μm which is larger than the sum (0.4 μm) of a mask misalignment dimension 0.15 μm of an optical reduction exposure device and the thickness 250 nm of the oxide film 6 containing no impurity. With this arrangement, the two steps close to each other can be formed on the surface of the oxide film pattern 9 containing no impurity. At the same time, the total step a 12, resulting from the sum of the thickness of the polycrystalline silicon 3 with the impurities and the thickness of the oxide film 6 with no impurity, can be divided into the first step a 10, having the height equal to the thickness of the polycrystalline silicon 3 with the impurities, and the second step a 11 having the height equal to the thickness of the oxide film 6 with no impurity. Thus, the large total step a 12 can be divided into the first and second steps a 10 and a 11 which are smaller than the total step a 12, and therefore the flow angle 17 of the BPSG film 13 is smaller when the total step a 12 is divided into the first and second steps a 10 and a 11 than when the total step a 12 is not divided, and therefore the wiring 18 formed on the BPSG film 13 is unlikely to be cut.

In the first embodiment, although the silicon oxide film 13 containing the impurities is the BPSG film, it may be a PSG film. Although the oxide film, the polycrystalline silicon film with the impurities, and the oxide film with no impurity are used as the first, second and third films, respectively, the first, second and third films may be of any type in so far as they will not be subjected to a viscous flow and deformation under those heat treatment conditions which cause a viscous flow of the BPSG film, and besides tow or all of these three films may be of the same kind.

EMBODIMENT 2

FIG. 3 shows features of a method of producing a semiconductor memory device according to a second embodiment of the present invention. The production method in this embodiment is basically similar to that (the embodiment 1) shown in FIGS. 1 and 2; however, the degree 19 of extension of an oxide film pattern 9 (which contains no impurity) from a polycrystalline silicon pattern 5 which contain impurity is not less than two times larger and not more than ten times larger than the thickness of deposition of a BPSG film 13, the extension amount 19 being equal to a value obtained by subtracting the thickness (which is substantially equal to the height of a second step a 11) of the oxide film 9 from the overlapping dimension 8 shown in FIGS. 1C, 1D, 2A and 3. In FIG. 3, the deposited thickness of the BPSG film 13 is 400 nm, and the thickness of the oxide film pattern 9 containing no impurity is 250 nm. Therefore, the extension degree of the oxide film pattern 9 is not less than 0.8 μm and is not more than 4.0 μm, and the overlapping dimension is 1.05 μm and is not more than 4.25 μm.

Figure 4A:
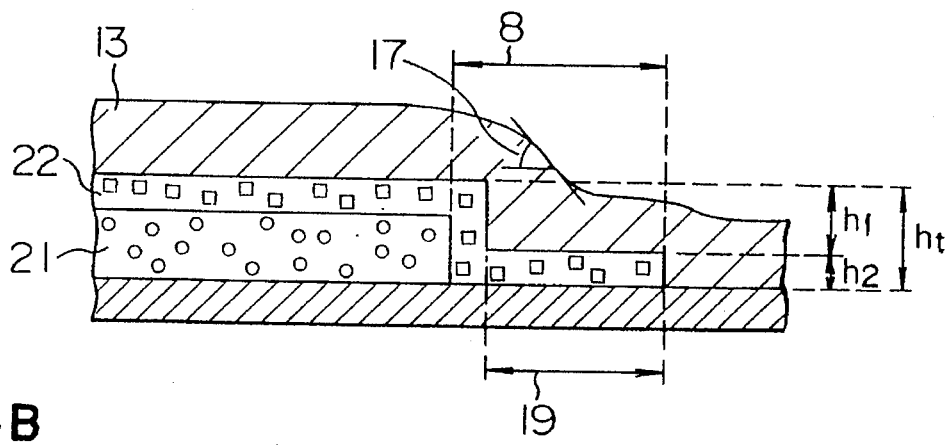
FIGS. 4A and 4B are illustrations showing the result of calculation of the flow angle of BPSG films for the purpose of explaining effects in the first, second, third and fourth embodiments of the invention.

The method of producing the semiconductor memory device of the above construction will now be described in more detail with reference to FIG. 4. Reference is now made to an improvement of the configuration of the step on the surface of the BPSG film which improvement is due to the degree 19 of extension of a third thin film pattern 22 from a second thin film 21. This is an essential feature of the present invention. FIG. 4 shows the relation between the degree 19 of extension of the third thin film pattern 22 from the second thin film pattern 21 and the flow angle 17 of the BPSG film. This relation has been obtained from a simulation (with respect to a simulation procedure, see H. Umimoto et al., in Tech. Dig. of IEDM, pp. 709–712, 199). In the simulation, the thickness of the second thin film as well as the height of the first step was h1 (500 nm), and the thickness of the third thin film as well as the height of the second step was h2 (200 nm), and the height of the total step was ht (700 nm). The total concentration of $B_2O_3$ and $P_2O_3$ (impurities) in the BPSG film was set to 16.6 mol %. Then the heat treatment was carried out at 900° C. for 30 minutes in a nitrogen atmosphere.

Figure 4B:
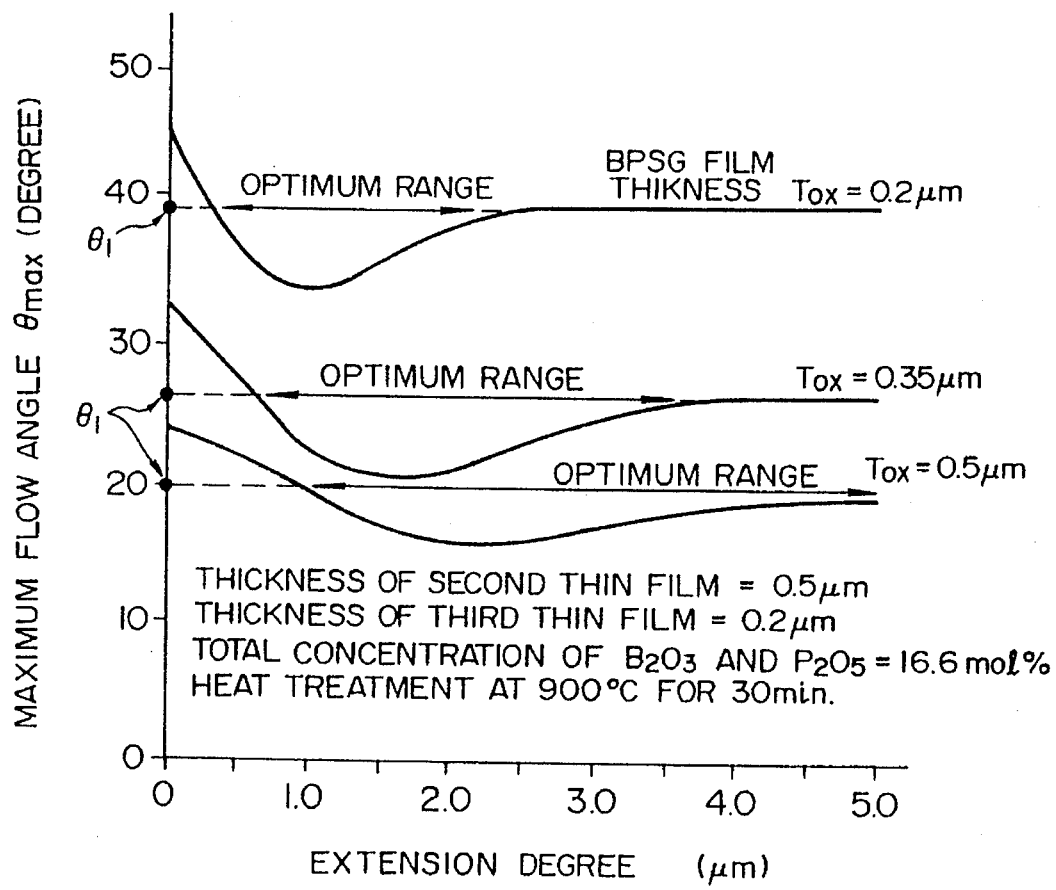
Figure 5A:
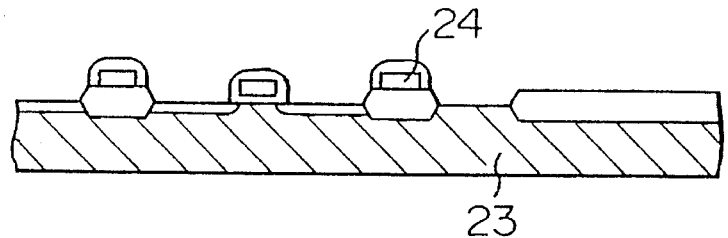
FIGS. 5A to 5D are partial, cross-sectional views showing a process for producing a semiconductor memory device according to the third embodiment of the invention.
Figure 5B:
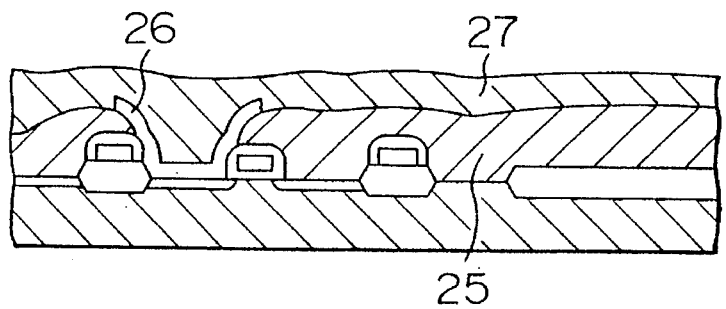
Figure 5C:
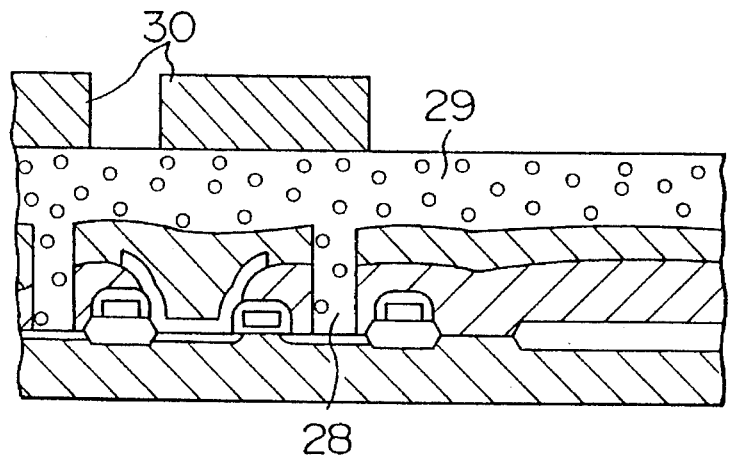
Figure 5D:
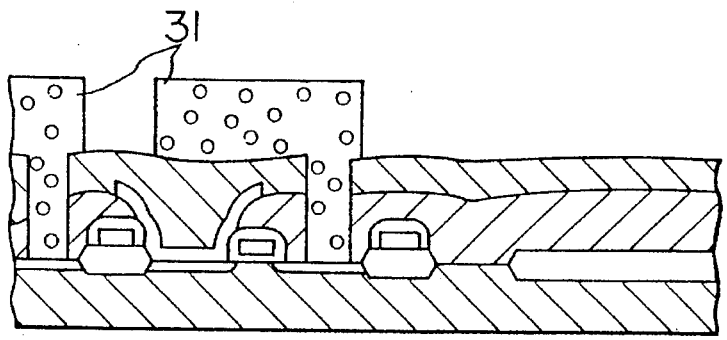

It will be appreciated from FIG. 4B that the flow angle of the BPSG film is smaller when the extension portion is provided than when the extension portion is not provided. Referring to this reason, when the extension portion is not provided, one step having the height ht of the total step is formed by the second and third thin films, and on the other hand, when the extension portion is provided, the step is divided into the two steps (i.e., the first and second steps) having the heights h1 and h2, respectively. As the degree of extension increases, the flow angle of the BPSG film abruptly decreases to a minimum value, and then again increases gradually toward a certain value. When the extension degree becomes very large, the flow angle becomes constant. The reason for this is that the viscous flow of the BPSG film at the first step is completely independent of the viscous flow of the BPSG film at the second step. Therefore, when the extension degree is very large, the maximum flow angle θmax of the BPSG film becomes equal to the flow angle θ1 at the larger one (h1 in FIG. 4) of the two divided steps.

Here, it is important to note that with various values of the BPSG film thickness, when the extension degree 19 is not less than two times larger and not more than ten times larger than the thickness 20 of deposition of the BPSG film, the maximum flow angle θmax is smaller than θ1. Referring to the reason for this, when the extension amount is not less than two times larger and not more than ten times larger than the thickness of the BPSG film, the distance between the two steps formed on the surface of the BPSG film becomes small, and the viscous flow of the BPSG film at the first step and the viscous flow of the BPSG film at the second step act on each other, so that the viscous flow of the BPSG film at the first step becomes larger than when the viscous flow is caused solely by the first step (that is, when the extension degree is more than ten times larger than the thickness of the BPSG film.

With this arrangement, in which the degree 19 of extension of the third thin film pattern 22 from the second thin film pattern 21, the degree being equal to a value obtained by subtracting the thickness of the third thin film from the overlapping dimension 8 of the second and third thin film patterns 21 and 22, is not less than two times larger and not more than ten times larger than the thickness 20 of deposition of the BPSG film, the total step is divided into the two steps, and the viscous flows occurring respectively at these two steps are caused to mutually act on each other to further decrease the flow angle of the BPSG film, thereby decreasing the cutting of the wiring formed on the BPSG film.

In the second embodiment, although the silicon oxide film 13 containing the impurities is the BPSG film, it may be a PSG film. Although the oxide film, the polycrystalline silicon film with the impurities, and the oxide film with no impurity are used as the first, second and third films, respectively, the first, second and third films may be of any type in so far as they will not be subjected to a viscous flow and deformation under those heat treatment conditions which cause a viscous flow of the BPSG film, and besides two or all of these three films may be of the same kind.

EMBODIMENT 3

Figure 6A:
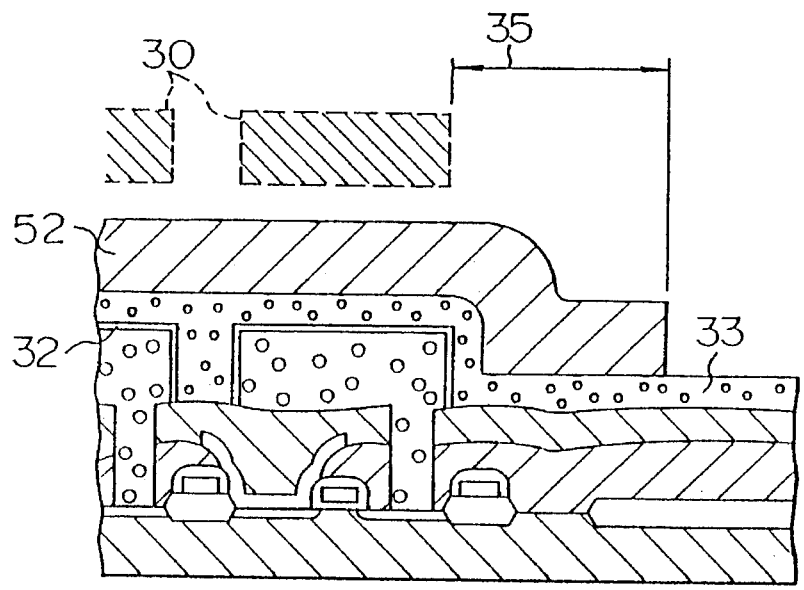
FIGS. 6A to 6C are partial, cross-sectional views showing the process for producing a semiconductor memory device according to the third embodiment of the invention.
Figure 6B:
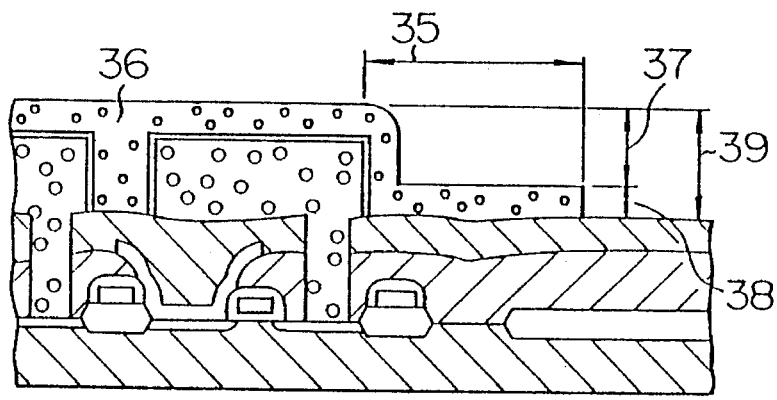
Figure 6C:
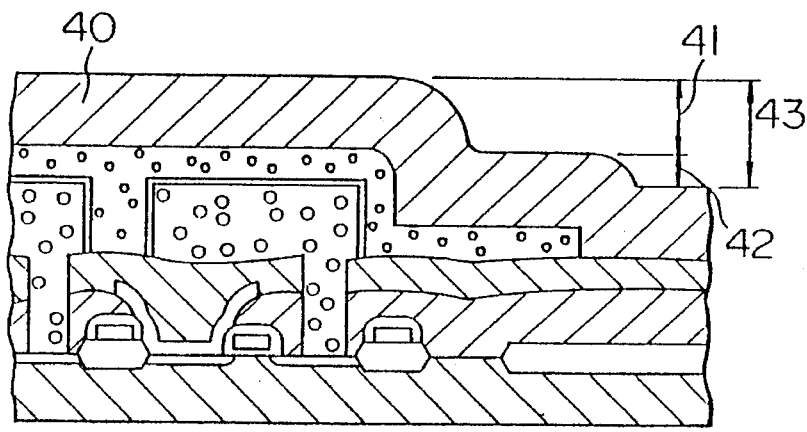

FIGS. 5, 6 and 7 show a method of producing a semiconductor memory device according to a third embodiment of the present invention. As shown in FIG. 5A, word lines 24 are first formed. Then, as shown in FIG. 5B, after a silicon oxide film 25 is deposited, bit lines 26 are formed, and a silicon oxide film 27 is further formed. Then, as shown in FIG. 5C, a contact window 28 is formed by an anisotropic etching in such a manner that it reaches an n+active region of a switching transistor formed on a p-type silicon substrate 23. Then, a first polycrystalline silicon film 29 containing impurities and having a thickness of 500 nm is deposited, and then a first resist pattern 30 is formed on this silicon film 29. Then, as shown in FIG. 5D, using the first resist pattern 30 as a mask, the first polycrystalline silicon 29 containing the impurities is subjected by RIE to an anisotropic etching to form a memory node pattern 31. Then, as shown in FIG. 6A, a dielectric film 32, composed of a silicon oxide film and a silicon nitride film and having a thickness of 6 nm, is formed on the surface of the memory node pattern 31, and a second polycrystalline silicon film 33, containing impurities and having a thickness of 200 nm, is deposited through this dielectric film 32. Then, a second resist pattern 52 is formed on this second polycrystalline silicon film 33 in such a manner that an overlapping dimension 35 of the first and second resist patterns 30 and 52 is 1.0 μm. Then, as shown in FIG. 6B, using this second resist pattern 34 as a mask, the second polycrystalline silicon film 33 containing the impurities is etched to form a cell plate electrode pattern 36 which has two steps, that is, a first step a 37 resulting from the memory node pattern 31 and a second step 38 resulting from the cell plate electrode pattern 36. At this time, since the thickness of the dielectric film 32 is much smaller as compared with the steps, the height 37 of the first step is equal to the thickness of the first polycrystalline silicon film 29 containing the impurities, and the height 38 of the second step is equal to the thickness of the second polycrystalline silicon film 33 containing the impurities, and the height of the total step 39 is equal to the sum of the heights of the first and second steps 37 and 38. Then, as shown in FIG. 6C, a BPSG film 40 having a thickness of 400 nm is deposited. A first step 41 and step 42 are formed on the surface of the BPSG film. At this time, the height 41 of the first step 41 is equal to the height of the first step 37, and the height 42 of the second step 42 is equal to the height 38 of the second step 38, and the height 43 of the total step 43 is equal to the height 39 of the total step 39. Then, a shown in FIG. 7A, the BPSG film 40 is caused to viscously flow by a heat treatment. At this time, preferably, a flow angle 44 of the BPSG film should be not more than 30 degree so as to prevent the cutting of a wiring 45 to be formed on the BPSG film. Finally, as shown in FIG. 7B, the aluminum wiring 45 is formed on the BPSG film 40.

The method of producing the semiconductor memory device of the above construction will now be described in more detail with reference to FIGS. 8 and 9.

Figure 8:
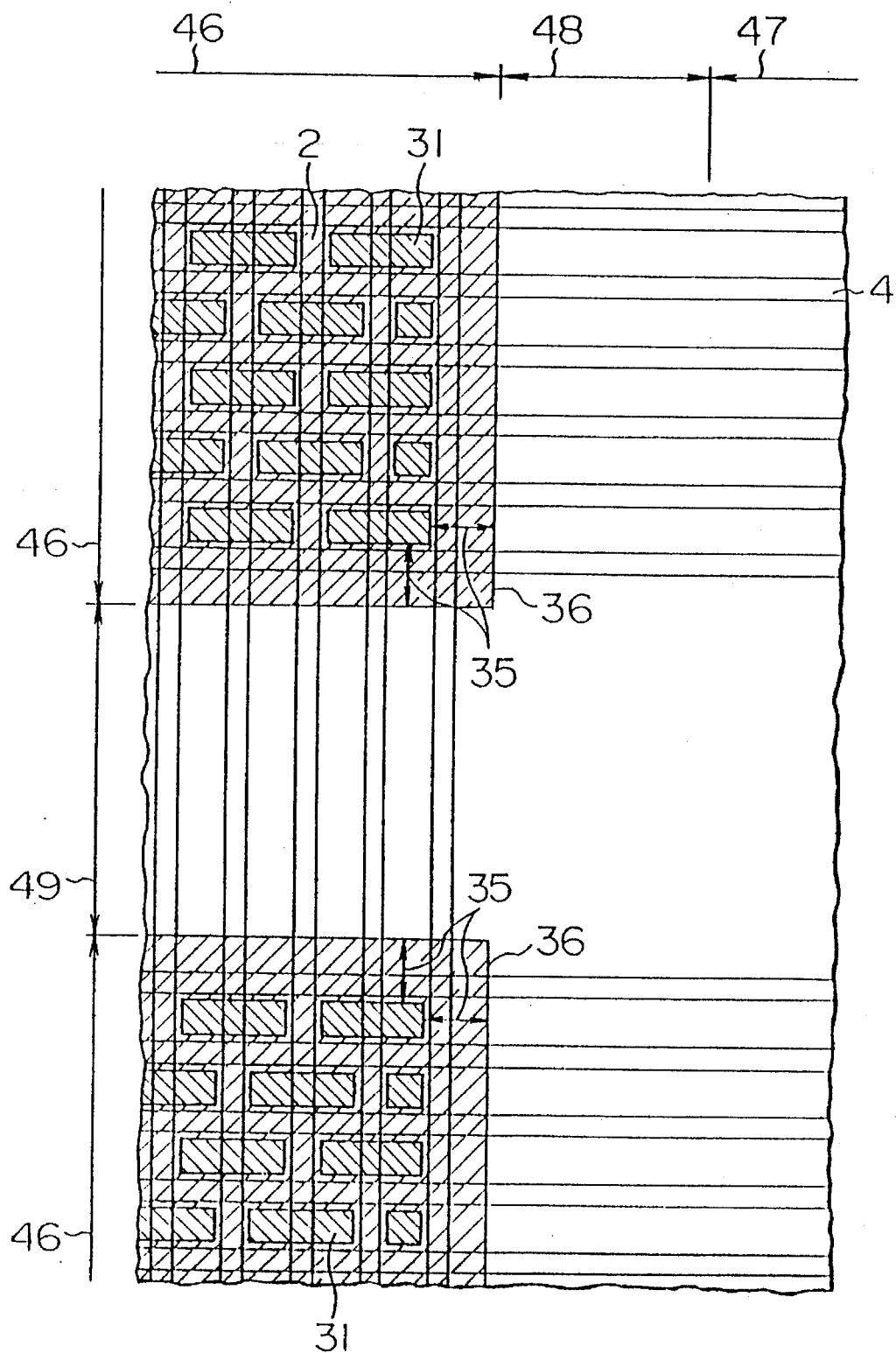
FIG. 8 is a schematic, top plan view of a mask pattern of the semiconductor memory device in the third embodiment.

FIG. 8 is a schematic top plan view of a mask pattern of the semiconductor memory device of this embodiment. In the method of producing the semiconductor memory device, a step of the aluminum wiring in a boundary region 48 between a memory cell array portion 46 and a peripheral circuit portion 47 or in a word line-backing contact forming region 49 is greatly influenced by the overlapping dimension 35 of the memory node pattern 31 and the cell plate electrode pattern 36.

Next, reference is now made to an improvement of the step configuration due to the overlapping dimension 35 of the memory node pattern 31 and the cell plate electrode pattern 36 which improvement is an important feature of the present invention. FIG. 9 shows the relation between the degree 37 of extension of the cell plate electrode pattern 36 from the memory node pattern 31 and the flow angle 44 of the BPSG film. This relation has been obtained from tests.

In the test, the height of the first step (which is equal to the thickness of the first polycrystalline silicon film containing the impurities) resulting from the memory node pattern was h1 (500 nm), and the height of the second step (which is equal to the thickness of the second polycrystalline silicon film containing the impurities) resulting from the cell plate electrode was h2 (200 nm), and the height or the total step was ht (700 nm). The total concentration of $B_2O_3$ and $P_2O_3$ (impurities) in the BPSG film was 16.6 mol %, and the heat treatment was carried out at 900° C. for 30 minutes in a nitrogen atmosphere.

Figure 9:
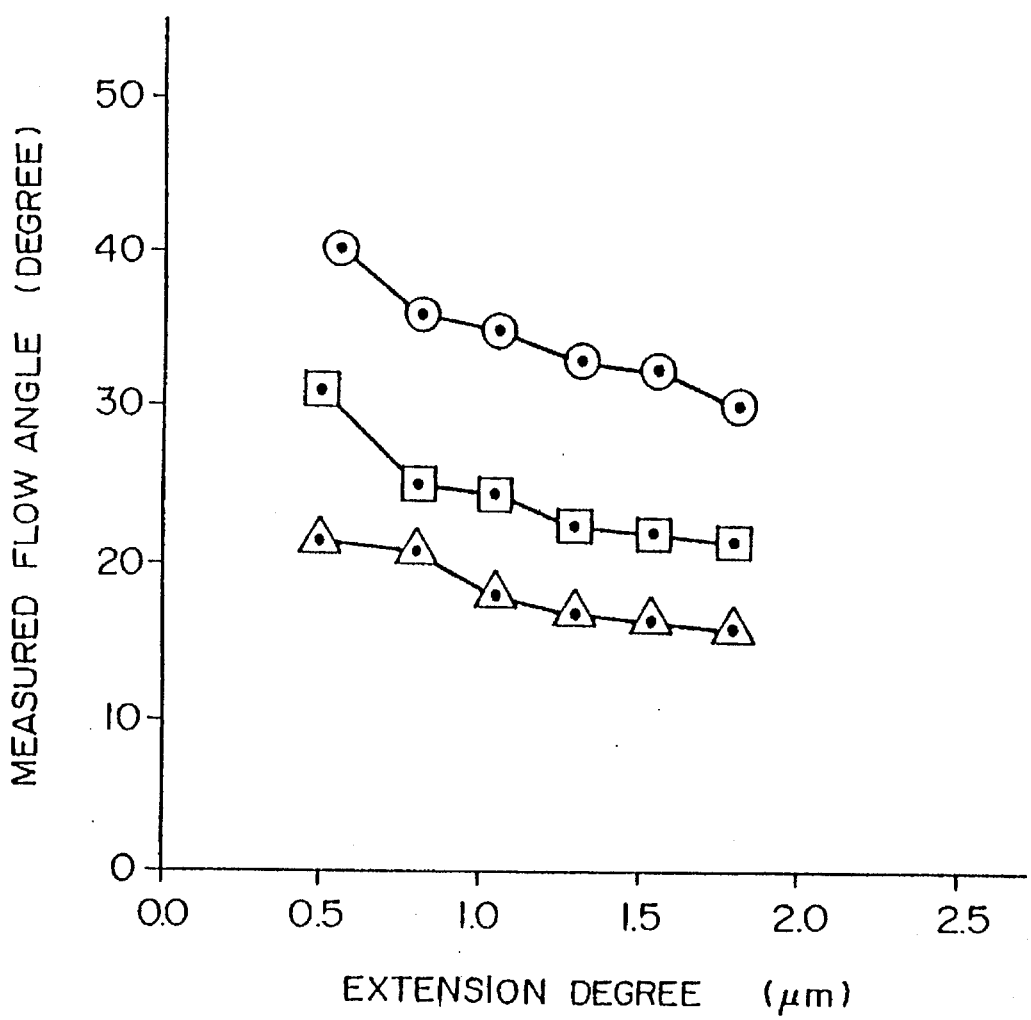
FIG. 9 is an illustration showing the result of experiment of the flow angle of BPSG films for the purpose of explaining effects in the third embodiment.

It will be appreciated from FIG. 9 that the flow angle of the BPSG film is made smaller when the extension portion is provided than when the extension portion is not provided. Referring to the reason for this, when the extension portion is not provided, one step having the height of the total step ht is formed by the memory node pattern and the cell plate electrode pattern, and on the other hand when the extension portion is provided, the step is divided into the two steps (that is, the first and second steps) having the height h1 and the height h2, respectively. When the extension degree increases, the flow angle of the BPSG film decreases. The reason for this can be explained as follows. AS the extension degree increase, the distinction between the first step and the second step becomes clearer, and the viscous flow of the BPSG film as the first step and the viscous flow of the BPSG film at the second step occur independently of each other. When these viscous flows of the BPSG film at the first an second steps occur independently of each other, the flow angle at each step is determined independently. Generally, the flow angle is large when the step is large, and therefore when the extension portion is provided, the maximum flow angle of the BPSG film is determined by the larger step. In FIG. 9, ht (=700 nm) >h1 (=500 nm)>h2 (=200 nm), and therefore the flow angle is improved to the flow angle due to the first step (500 nm).

As described above, the overlapping dimension is larger than the sum (0.35 μm) of a mask misalignment dimension 0.15 μm of an optical reduction exposure device and the thickness 200 nm of the second polycrystalline silicon containing the impurities. With this arrangement, the two steps close to each other can be formed on the surface of the cell plate electrode pattern. At the same time, the total step, resulting from the sum of the thickness of the memory node pattern and the thickness of the cell plate electrode pattern, can be divided into the first step, having the height equal to the thickness of the memory node pattern, and the second step having the height equal to the thickness of the cell plate electrode pattern. Thus, the large total step can be divided into the first and second steps which are smaller than the total step, and therefore the flow angle of the BPSG film is smaller when the total step is divided into the first and second steps than when the total step is not divided, and therefore the wiring formed on the BPSG film is less liable to be cut.

As described above, in this embodiment, the overlapping dimension 35 of the memory node pattern 31 and the cell plate electrode pattern 36 is increased, and the two steps resulting respectively from the memory node pattern 31 and the cell plate electrode pattern 36 are formed on the surface of the cell plate electrode pattern 36. With this arrangement, the flow angle 44 at the step which angle is determined by the viscous flow of the BPSG film 40 can be decreased.

In the third embodiment, although the memory node 31, the cell plate electrode 36 and the BPSG film 40 are formed after the bit lines 4 are formed, they may be formed before the bit lines 4 are formed.

In the third embodiment, although the silicon oxide film 40 containing the impurities is the BPSG film, it may be a PSG film containing impurities.

EMBODIMENT 4

Figure 10:
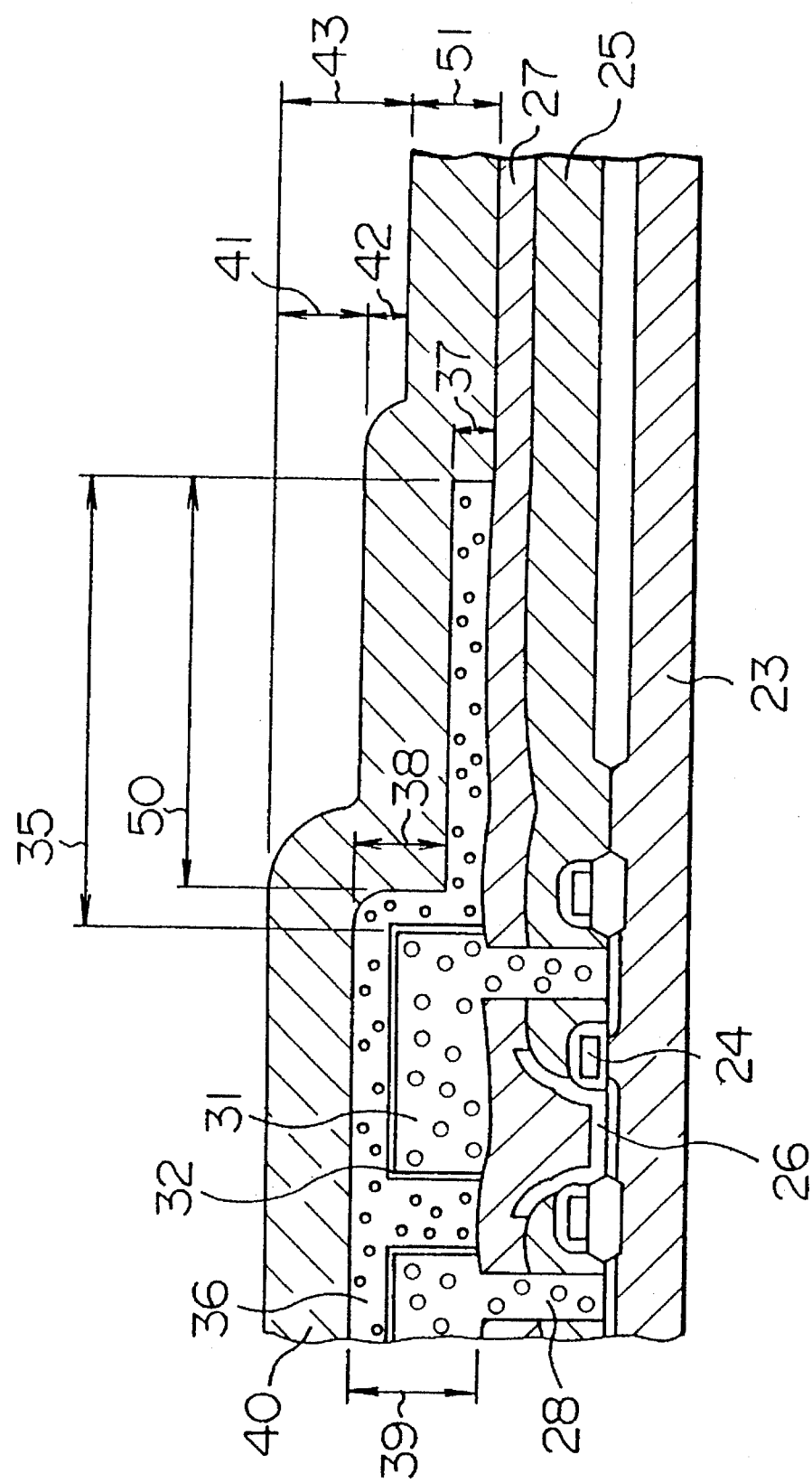
FIG. 10 is a partial, cross-sectional view showing a process for producing a semiconductor memory device according to the fourth embodiment of the invention.
Figure 11A:
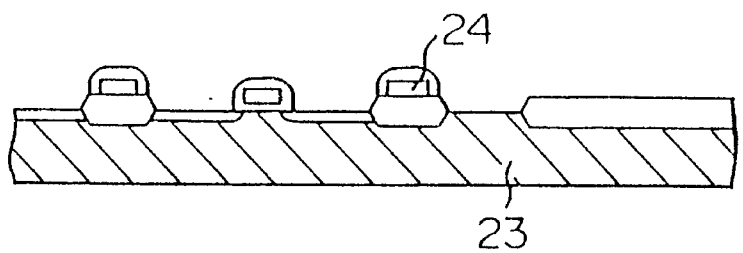
FIGS. 11A to 11D are partial, cross-sectional views showing a conventional process for producing a semiconductor memory device.
Figure 11B:
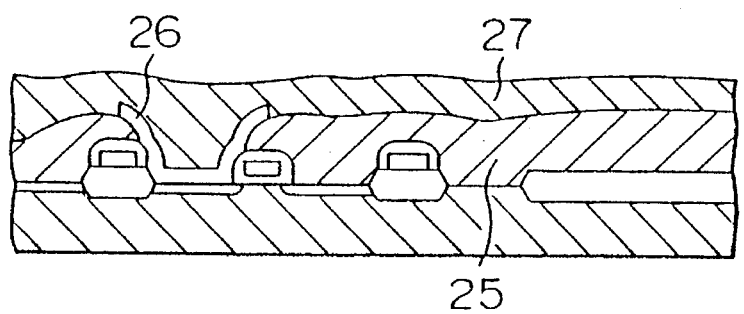
Figure 11C:
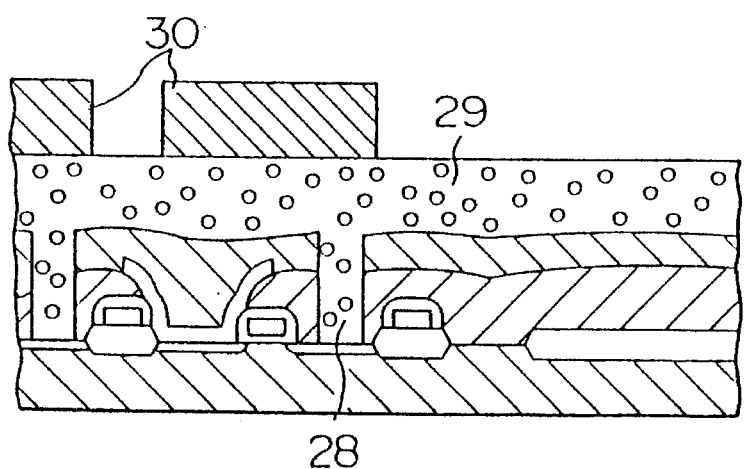
Figure 11D:
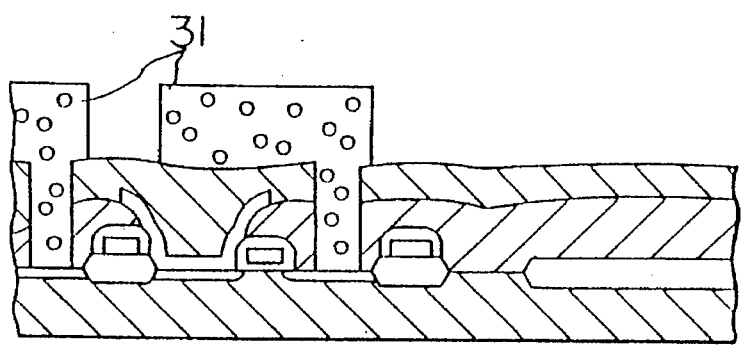
Figure 12A:
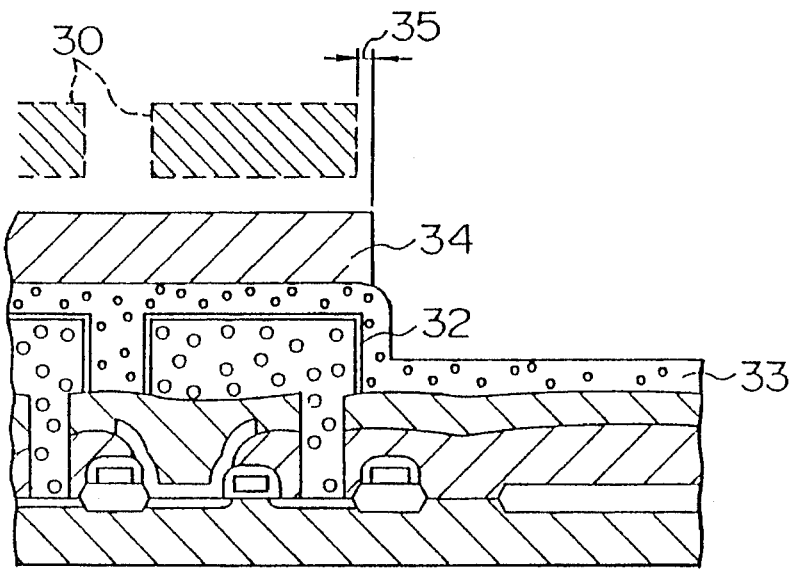
FIGS. 12A to 12C are partial, cross-sectional views showing the conventional process for producing a semiconductor memory device.
Figure 12B:
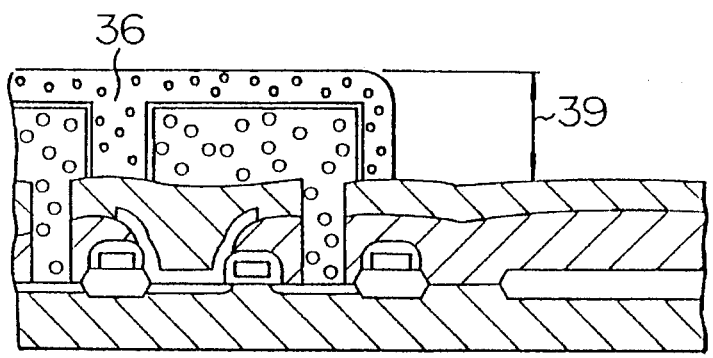
Figure 12C:
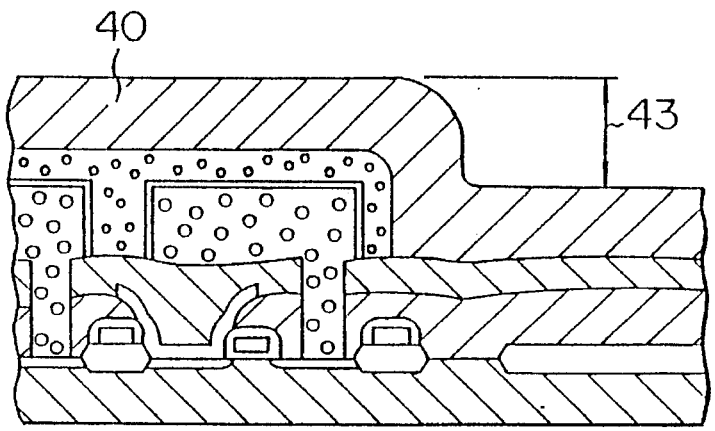
Figure 13A:
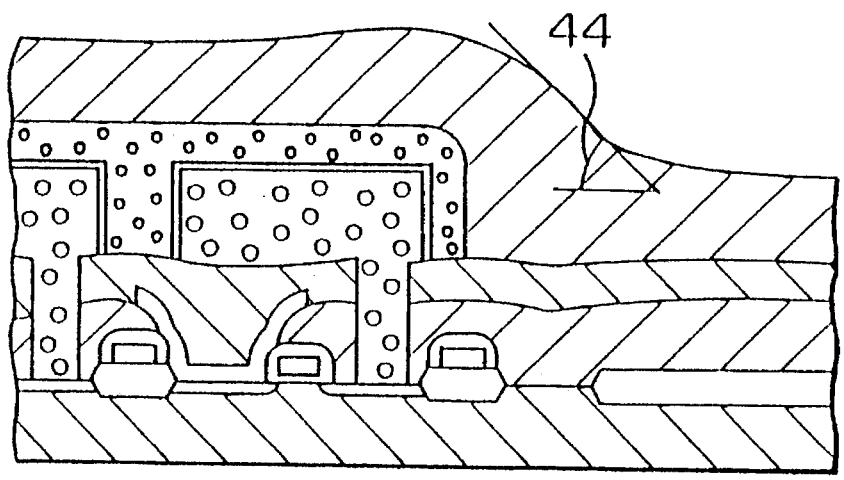
FIGS. 13A and 13B are partial, cross-sectional views showing the conventional process for producing a semiconductor memory device.
Figure 13B:
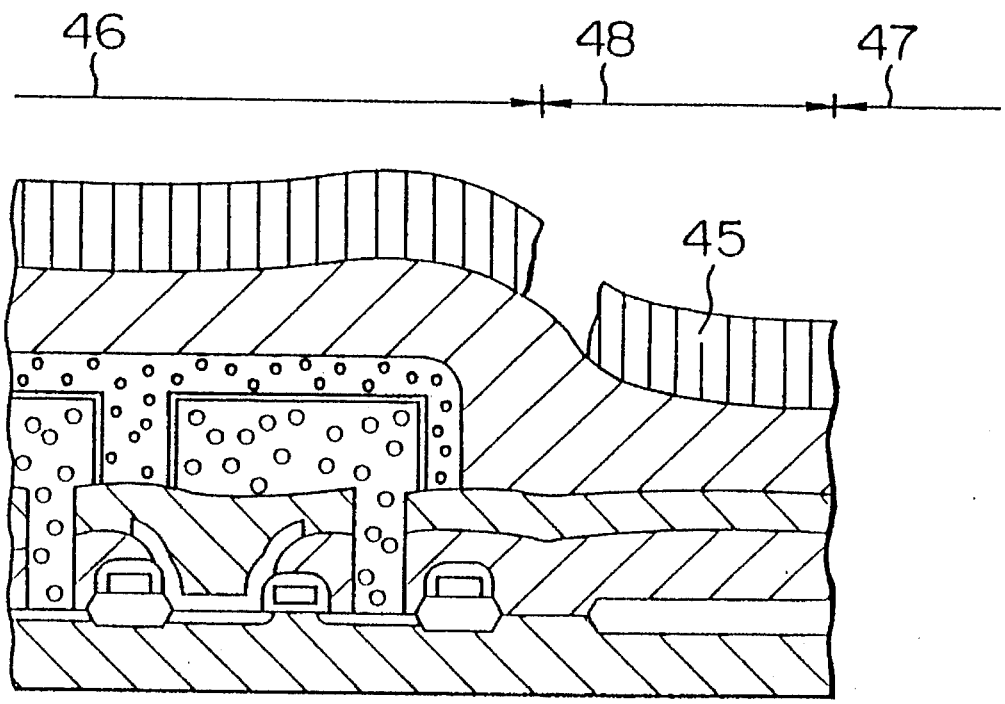

FIG. 10 shows features of a method of producing a semiconductor memory device according to a fourth embodiment of the present invention. This production method is basically similar to that (the embodiment 3) shown in FIGS. 5, 6 and 7; however, the degree 50 of extension of a cell plate electrode pattern 36 from a memory node pattern 31, obtained by subtracting the thickness of the second polycrystalline silicon 33 (which contains impurities) from the overlapping dimension 35 (FIG. 6A) of the first resist pattern and the second resist pattern, is not less than two times larger and not more than ten times larger than the thickness 51 of deposition of a BPSG film 40. In FIG. 10 showing a cross-sectional view corresponding to FIG. 6C, the thickness 51 of deposition of the BPSG film is 400 nm, and therefore the degree 50 of extension of the cell plate electrode pattern 36 is not less than 0.8 μm and not more than 4.0 μm. Reference is now made to an improvement of the configuration of the step on the surface of the BPSG film which improvement is due to the degree 50 of extension of the cell plate electrode pattern 36 from the memory node pattern 31. This is an essential feature of the present invention. In FIG. 10, assuming that a silicon oxide film (interlayer insulation film) 27 is completely flat and that the thickness of a dielectric film 32 is very small, the memory node pattern 31, the cell plate electrode pattern 36 and the BPSG film 40 on the silicon oxide film 27 are completely the same structure as shown in FIG. 4. Therefore, the improvement of the configuration of the step on the surface of the BPSG film 40 which improvement is due to the degree 50 of extension of the cell plate electrode pattern 36 from the memory node pattern 31 is as described in the second embodiment.

Thus, the degree 50 of the extension of the cell plate electrode pattern 36 from the memory node pattern 31, which is equal to a value obtained by subtracting the thickness of the second polycrystalline silicon 33 (which contains impurities) from the overlapping dimension 35 of the memory node pattern 31 and the cell plate electrode pattern 36, is not less than two times larger and not more than ten times larger than the thickness 51 of deposition of the BPSG film 40. With this arrangement, the total step is divided into the two steps, and the viscous flows occurring respectively at these two steps are caused to act on each other, so that the flow angle 44 of the BPSG film is further decreased, thereby reducing the cutting of the wiring 45 formed on the surface of the BPSG film 40.

In the fourth embodiment, although the memory node 31, the cell plate electrode 36 and the BPSG film 40 are formed before the bit lines 4 are formed, they may be formed before the bit lines 4 are formed.

In the fourth embodiment, although the silicon oxide film 40 containing the impurities is the BPSG film, it may be a PSG film containing impurities.

As described above, in the present invention, the interlayer insulation film is formed on the semiconductor substrate including the switching transistor. Then, the memory node pattern reaching the active region of the switching transistor is formed. The insulation film is formed on the surface of the memory node. The cell plate electrode is formed in such a manner that the two steps resulting respectively from the memory node pattern and the cell plate electrode pattern are formed on the surface of the cell plate electrode. Then, the BPSG film deposited thereon is caused to viscously flow by a heat treatment. With this construction, without increasing the number of the conventional masks, the configuration of the step in the boundary region between the memory cell array portion and the peripheral circuit portion, or in the word line-backing contact forming region, is made gentle, thereby preventing the lowering of the yield of the aluminum wiring which is caused by the cutting of the aluminum wiring and the remaining of a residue of etching for the contact-forming embedded electrode (for example, tungsten).

What is claimed is:

1. A method of producing a semiconductor device comprising the steps of:

depositing a second thin film on a semiconductor substrate or a first thin film;

forming a pattern on said second thin film by a first photoresist, and etching said second thin film, using said first photoresist as a mask, to form a second thin film pattern, said second thin film extending by a first length on said semiconductor substrate or said first thin film to form a first step;

depositing a third thin film on an entire surface including said second thin film;

etching said third thin film, using a second photoresist on said third thin film as a mask, to form a third thin film pattern covering said second thin film, said third thin film extending by a second length on said second thin film to form a second step;

depositing a silicon oxide film on said third thin film, said silicon oxide film containing impurities, wherein said first step and said second step resulting respectively from the pattern of said second thin film and the pattern of said third thin film are formed on the surface of an end portion of said third thin film pattern; and causing said silicon oxide film to viscously flow by a heat treatment.

2. A method according to claim 1, in which said first, second and third thin films have less viscous flow than said silicon oxide film containing impurities.

3. A method according to claim 2, in which said silicon oxide film containing the impurities is made of borophosphosilicate glass.

4. A method according to claim 1, in which viscous flowing of said silicon oxide film, occurring at said first step and viscous flowing of said silicon oxide film, occurring at said second step, mutually interact with each other.

5. A method according to claim 4, in which said first, second and third thin films have less viscous flow than said silicon oxide film containing impurities.

6. A method according to claim 5, in which said silicon oxide film containing the impurities is made of borophosphosilicate glass.

7. A method of producing a semiconductor device comprising the steps of:

depositing a second thin film on a semiconductor substrate or a first thin film;

forming a pattern on said second thin film by a first photoresist, and etching said second thin film, using said first photoresist as a mask, to form a second thin film pattern, said second thin film extending by a first length on said semiconductor substrate or said first thin film to form a first step;

depositing a third thin film on an entire surface including said second thin film;

etching said third thin film, using a second photoresist on said third thin film as a mask, to form a third thin film pattern covering said second thin film, said third thin film extending by a second length on said second thin film to form a second step, wherein said first step and said second step resulting respectively from said second thin film pattern and said third thin film patter are formed on the surface of an end portion of said third thin film pattern;

depositing a silicon oxide film on said third thin film, said silicon oxide film containing impurities; and causing said silicon oxide film to viscously flow by a heat treatment;

wherein a value obtained by subtracting the thickness of said third thin film from the length by which said third thin film pattern extends on said second thin film pattern to the outward periphery of said third thin film pattern is not less than two times larger and not more than ten times larger than the thickness of deposition of said silicon oxide film.

8. A method according to claim 7, in which said first, second and third thin films have less viscous flow than said silicon oxide film containing impurities.

9. A method according to claim 8, in which said silicon oxide film containing the impurities is made of borophosphosilicate glass.

10. A method of producing a semiconductor device comprising the steps of:

forming an interlayer insulation film on a semiconductor substrate including a switching transistor, and forming a contact window reaching an active region of said switching transistor;

depositing first polycrystalline silicon containing impurities in such a manner that said first polycrystalline silicon is in contact with said active region of said switching transistor through said contact window;

forming a pattern on said first polycrystalline silicon by a first photoresist, and etching said first polycrystalline silicon, using said first photoresist as a mask, to form a first polycrystalline silicon pattern;

forming a dielectric film on a surface of said first polycrystalline silicon, and further depositing second polycrystalline silicon on said dielectric film and on said first polycrystalline silicon layer, said second polycrystalline silicon containing impurities;

forming a pattern on said second polycrystalline silicon by a second photoresist, and etching said second polycrystalline silicon, using said second photoresist as a mask, to form a second polycrystalline silicon pattern;

depositing a silicon oxide film on said second polycrystalline silicon, said silicon oxide film containing impurities; and causing said silicon oxide film to viscously flow by a heat treatment;

wherein the length by which said second polycrystalline silicon pattern extends on said interlayer insulation film outward from said first polycrystalline silicon layer is not less than two times larger and not more than four times larger than the thickness of said first polycrystalline silicon film.

11. A method according to claim 10, in which said silicon oxide film containing the impurities is made of borophosphosilicate glass.

* * * * *